United States Patent [19]
Brennan et al.

[11] Patent Number: 5,851,913
[45] Date of Patent: *Dec. 22, 1998

[54] METHOD FOR FORMING A MULTILEVEL INTERCONNECT STRUCTURE OF AN INTEGRATED CIRCUIT BY A SINGLE VIA ETCH AND SINGLE FILL PROCESS

[75] Inventors: William S. Brennan; Robert Dawson; H. Jim Fulford, Jr.; Fred N. Hause; Basab Bandyopadhyay, all of Austin; Mark W. Michael, Cedar Park, all of Tex.

[73] Assignee: Advanced Micro Devices, Inc.

[ * ] Notice: The term of this patent shall not extend beyond the expiration date of Pat. No. 5,679,605.

[21] Appl. No.: 655,246

[22] Filed: Jun. 5, 1996

[51] Int. Cl.$^6$ ................................................ H01L 21/4763
[52] U.S. Cl. ........................... 438/622; 438/627; 438/637
[58] Field of Search ..................... 437/194, 195, 437/203; 438/622, 624, 627, 637

[56] References Cited

U.S. PATENT DOCUMENTS

| | | | |
|---|---|---|---|
| 5,354,712 | 10/1994 | Ho et al. | 437/195 |
| 5,399,235 | 3/1995 | Mutsaers et al. | 437/195 |
| 5,451,543 | 9/1995 | Woo et al. . | |
| 5,514,622 | 5/1996 | Bornstein et al. . | |
| 5,580,825 | 12/1996 | Labunov et al. . | |
| 5,587,339 | 12/1996 | Wyborn et al. . | |
| 5,679,605 | 10/1997 | Brennan et al. . | |

*Primary Examiner*—Tuan H. Nguyen
*Attorney, Agent, or Firm*—Kevin L. Daffer; Conley, Rose & Tayon

[57] ABSTRACT

A multilevel interconnect structure is provided. The multilevel interconnect structure includes two, three or more levels of conductors formed according to at least two exemplary embodiments. According to one embodiment, the contact structure which links conductors on one level to an underlying level is formed by a single via etch step followed by a fill step separate from a fill step used in filling the via. In this embodiment, the via is filled with a conductive material which forms a plug separate from the material used in forming the interconnect. In another exemplary embodiment, the step used in filling the via can be the same as that used in forming the interconnect. In either instance, a via is formed through a first dielectric to underlying conductors. A second dielectric is patterned upon the first dielectric and serves to laterally bound the fill material used in producing the overlying interconnect. Regardless of the process sequence chosen, the interlevel dielectric structure is left substantially planar in readiness for subsequent interconnect levels dielectically deposited thereon.

20 Claims, 4 Drawing Sheets

METHOD FOR FORMING A MULTILEVEL INTERCONNECT STRUCTURE OF AN INTEGRATED CIRCUIT BY A SINGLE VIA ETCH AND SINGLE FILL PROCESS

BACKGROUND OF THE INVENTION

1. Field of the Invention

This invention relates to semiconductor fabrication and more particularly to an improved process for forming a multilevel interconnect structure. The improved process is used to produce a set of conductors within a single elevational level and is further used to connect a select number of those conductors to an underlying contact area by using a single via etch step followed by either a single or dual fill step.

2. Description of the Relevant Art An integrated circuit includes numerous conductors extending across the topography of a monolithic substrate. A set of interconnect lines (or conductors) which serve to electrically connect two or more components within a system is generally referred to as a "bus". Conductors within a bus are typically isolated from each other and from underlying conductive elements by a dielectric. A suitable dielectric used in semiconductor fabrication includes, for example, silicon dioxide ("oxide"). Conductors are thereby lithography patterned across the semiconductor topography, wherein the topography comprises a substrate with a dielectric placed thereon. The topography can also include one or more layers of conductors, each of which are typically covered by a layer of dielectric material. Accordingly, the layers of conductors overlaid with a dielectric present a topography upon which a subsequent layer or layers of conductors can be patterned to form a multilevel interconnect structure. A multilevel interconnect structure must therefore include at least two layers (or levels) of conductors, wherein select conductors in one level are interconnected by contacts to select conductors in another level.

There are numerous challenges involved in manufacturing a reliable multilevel interconnect structure. First, the interconnect structure must have intralevel and interlevel dielectrics which electrically separate the spaced conductors. The dielectric material therefore serves to minimize propagation delay in critical path conductors as well as cross-talk between conductors. Second, the multilevel interconnect structure must have contacts which are of low ohmic resistance. The contact material and contact geometry must be carefully chosen to ensure minimal resistance between conductors where interconnection is desired. Vias which extend between levels must be reproduceably formed and thereafter be reproduceably filled with contact material even when the vias have high aspect ratios. Third, the multilevel interconnect structure must be produced in a substantially planar form. That is, to reduce step height problems and to ensure accurate projection printing of small features sizes, the interlevel dielectric must have a fairly planar upper surface. Non-planarity problems are compounded as the number of levels increases. Thus, a multilevel interconnect structure (one having two or more levels) necessitates planarizing the dielectric surface in readiness for the next level or levels of conductors.

While there are many challenges involved in manufacturing a multilevel interconnect structure, it appears that planarization seems particularly acute with many modern processes. Planarization has received increasing attention due to the limitations involved in projection printing ultra fine-line geometries. Accurate projection printing is limited by depth of focus issues involved in printing small features across topographies which sharply vary in elevation. As device geometries (i.e., features sizes) continue to shrink, a need arises for producing interlevel dielectric layers having not just local dielectric surfaces which are planar but, more importantly, global planar surfaces which extend across large portions of a semiconductor die if not the entire die.

SUMMARY OF THE INVENTION

The problems outlined above are in large part solved by an improved multilevel interconnect structure. The multilevel structure is produced by a process of forming a contact using either a single via etch step followed by a pair of fill steps (dual steps), or a single via etch step followed by a single fill step. In the former instance, an interlevel dielectric is formed upon a first set of conductors (metal, polysilicon or implant regions). The dielectric includes an upper surface having numerous vias etched therein. A first of two fill operations serves to fill the via with a plug material. Another fill operation is thereafter used to form conductors, some of which are formed over the plugs. In the latter instance, the vias and adjacent dielectric upper surfaces are used to receive conductive material which serve as a plug formed as a separate material from the second set of conductors, or as a plug formed from the same material as the second set of conductors.

According to one embodiment, the present invention contemplates a process of forming a multilevel interconnect structure using a single via etch step and two fill steps. This process involves removing a first dielectric in regions directly above a first set of conductors formed within an interconnect level. A barrier layer is preferably deposited within the ensuing via and across the first dielectric. Thereafter, a conductive material is deposited across the barrier layer and particularly within the barrier-covered via. The barrier-covered via thereby comprises a first fill region in which, after planarization of the conductive fill material to an upper surface of the barrier layer, a plug is produced. The plug exists solely within the barrier-covered trench as a result of the first fill process. A second fill process is needed, however, to complete a second set of conductors which are electrically connected to the plug. The second fill sequence begins by producing a second dielectric upon the first dielectric between select pairs of plugs. The second dielectric thereby surrounds a fill region into which a second conductive material is deposited. The second conductive material after deposition and planarization, forms a second set of conductors, some of which reside upon the plug. The plug therefore extends between select ones of the second and first set of conductors.

According to another exemplary embodiment, a multilevel interconnect structure is formed by a single via etch and single fill process. In this embodiment, a separate conductive material for the plug from that of the second set of conductors is not needed. More specifically, a single conductive material can be deposited into the via as well as into regions bounded by the second dielectric. Thus, in this embodiment, the second set of conductors extend laterally across a barrier layer, but also extend downward onto the upper surface of the first set of conductors. This unibody structure which serves as a vertical spacer between first and second sets of conductors and as second conductors themselves, can be made from any electrically conductive material, a preferred material being aluminum-copper alloy, or copper.

BRIEF DESCRIPTION OF THE DRAWINGS

Other objects and advantages of the invention will become apparent upon reading the following detailed description and upon reference to the accompanying drawings in which.

Figure 1:
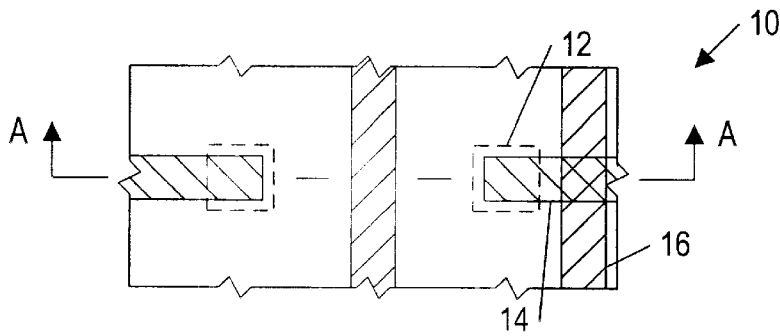
FIG. 1 is a partial top plan view of a multilevel interconnect structure illustrating, according to one embodiment, three levels of interconnect.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a top plan view of a multilevel interconnect structure 10. Structure 10 is shown, according to one exemplary embodiment, having three levels of interconnect. Each level of interconnect is formed on an elevational level separate from the other levels of interconnect. Therefore, each level of interconnect comprises a set of conductors shown in FIG. 1 as a first set of conductors 12, a second set of conductors 14, and a third set of conductors 16. Each set of conductors formed on a distinct level are patterned using varying techniques—patterned either from a single layer selectively removed or patterned from adding material to fill areas. The first, second and third conductors are also dielectically spaced from each other using a series of interlevel dielectrics.

Figure 2:
FIG. 2 is a cross-sectional view along plane A of FIG. 1, wherein a set of conductive regions (e.g., first set of conductors) are formed upon a semiconductor topography.

Referring now to FIGS. 2–10, structure 10 is formed according to one exemplary embodiment in which the second set of conductors 14 are patterned and connected to underlying first set of conductors 12 using a single via etch and dual fill process. This process begins by forming first set of conductors 12 upon a semiconductor topography 18, as shown in FIG. 2. Alternatively, as shown in dashed line 12', first set of conductors 12 may comprise an ion implant region rendered conductive by a concentration of dopants placed therein. Accordingly, it is understood that the first set of conductors can be either selectively patterned refractory metal (or polysilicon) 12 or an ion implant region 12'. Further, it is understood that semiconductor topography 18 includes either a semiconductor substrate, a dielectric placed over a semiconductor substrate, or a dielectric placed over one or more levels of interconnect. Thus, a first set of conductors may either be target locations of ion implant regions, the first in a series of interconnect levels, or the second or subsequent level of numerous levels of underlying interconnect.

Figure 3:
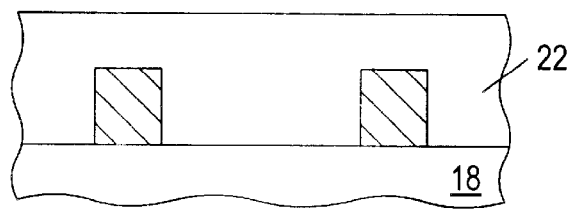
FIG. 3 illustrates a processing step subsequent to that of FIG. 2, wherein a first dielectric is deposited across the first set of conductors.
Figure 4:
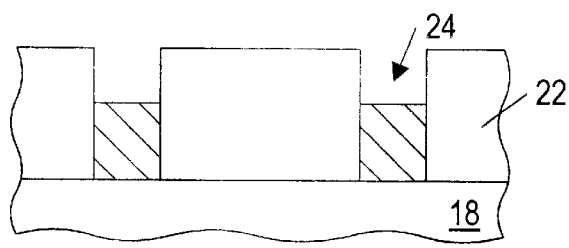
FIG. 4 illustrates a processing step subsequent to that of FIG. 3, wherein the first dielectric is selectively removed to form vias directly above the first set of conductors.

In FIG. 3, a first dielectric 22 is deposited across and between first set of conductors 12. First dielectric 22 includes any electrically insulative material, preferably an oxide deposited from a chemical-vapor deposition (CVD) chamber using, for example, a silane, TEOS, or ozone source. In FIG. 4, the upper surface of first dielectric 22 is patterned using a photoresist, such that selective regions of first dielectric 22 are removed directly above first set of conductors 12. The removed regions of first dielectric 22 are hereinafter referred to as vias 24. Vias 24 are preferably formed using a plasma etch technique, whereby substantially straight sidewalls are produced within first dielectric 22. Vias 24 extend from the upper surface of first dielectric 22 to the upper surface of conductors 12. It is important that the plasma etch technique substantially remove all dielectric 22 from the upper surface of conductors 12 so as to minimize any resistance in ensuing contact structure.

Figure 5:
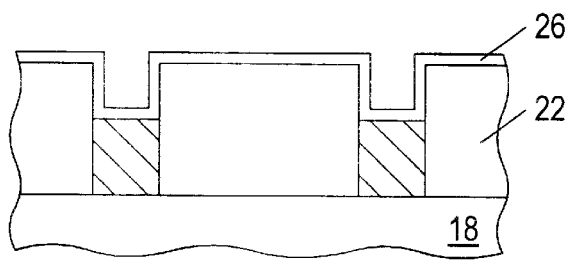
FIG. 5 illustrates a processing step subsequent to that of FIG. 4, wherein a barrier layer is deposited upon the first dielectric and vias.
Figure 6:
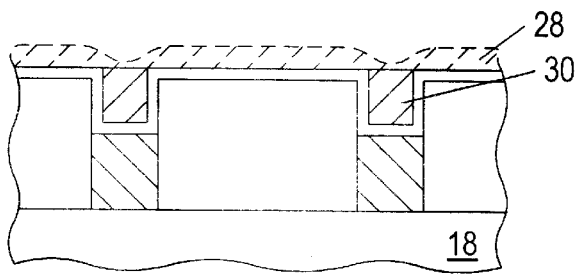
FIG. 6 illustrates a processing step subsequent to that of FIG. 5, wherein plugs are formed within the vias by filling the barrier-covered vias with a first conductive material and thereafter planarizing that conductive material.

FIG. 5 illustrates deposition of a barrier layer 26 upon first dielectric 22 and within vias 24. Barrier layer 26 serves to enhance adhesion between first dielectric 22 and any overlying conductive material. Preferably, barrier layer 26 comprises titanium (Ti), but also may include tungsten (W), nitrogen (N), or a combination thereof. According to one embodiment, barrier layer 26 is made of TiN deposited to a thickness of approximately 1,000 angstroms. FIG. 6 illustrates deposition of a first conductive material 28 upon barrier 26. Conductive material 28 is deposited so as to completely fill via 24. Preferably, first conductive material 28 comprises W. Using a planarization process, the upper surface of material 28 is removed to an elevational level substantially equal to the upper surface of barrier layer 26. Accordingly, a plug 30 is formed having an upper surface commensurate with the upper surface of barrier layer 26. Barrier layer 26 thereby serves not only as an adhesion layer, but also provides an etch stop or polish stop.

Figure 7:
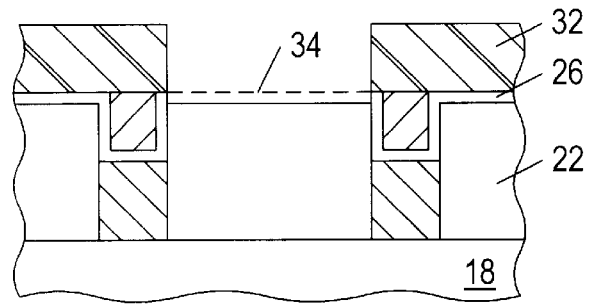
FIG. 7 illustrates a processing step subsequent to that of FIG. 6, wherein the barrier layer is selectively removed.
Figure 8:
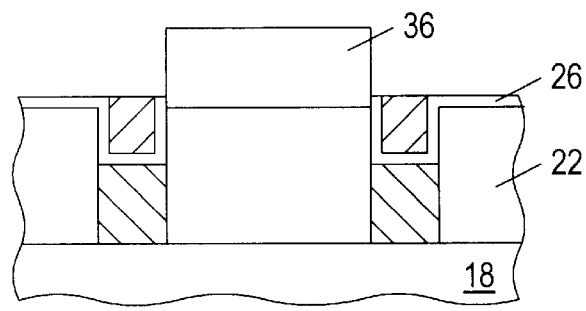
FIG. 8 illustrates a processing step subsequent to that of FIG. 7, wherein a second dielectric is formed in the region in which the barrier layer is selectively removed.

FIG. 7 illustrates exposure of barrier layer 28 between plugs 30 by depositing and selectively patterning a photoresist layer 32. In areas removed of photoresist 32, the underlying barrier layer 26 is exposed to an etch solution which selectively removes barrier 26 while retaining the underlying first dielectric 22. Removal of barrier 26 is shown by dashed lines 34. FIG. 8 illustrates subsequent deposition of a second dielectric 36 upon regions removed of barrier 26. Second dielectric 36 extends above the upper surface of not only barrier 26 but also plug 30 so as to form a fill region bounded by second dielectric 36. The fill region (more specifically the second fill region, wherein the first fill region is that used to fill vias 24) thereafter readily accepts a second conductive material 38, shown in FIG. 9. According to a preferred embodiment, second dielectric 36 is blanket deposited and thereafter selectively removed to leave material over areas removed of barrier 26 (shown in FIG. 8) The fill region (more specifically the second fill region, wherein the first fill region is that used to fill vias 24) thereafter readily accepts a second conductive material 38, shown in FIG. 9.

Figure 9:
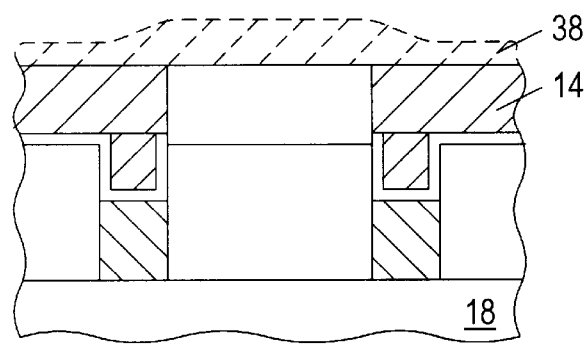
FIG. 9 illustrates a processing step subsequent to that of FIG. 8, wherein a second conductive material is deposited and thereafter planarized to conclude steps shown in FIGS. 2–9 for forming a second set of conductors electrically coupled to the first set of conductors by a single via etch and dual fill process according to one embodiment of the present invention.

FIG. 9 illustrates deposition of second fill material 38, and subsequent removal of material 38 at upper elevational regions using an etchback or polish sequence. The etchback or polish removes the upper surfaces of material 38 commensurate with the upper surface of second dielectric 36. Accordingly, second dielectric 36 provides an etch stop. Second dielectric 36 also defines a thickness of ensuing second set of conductors 14. The upper surfaces of conductors 14 are thereby coplanar with upper surfaces of second dielectric 36. Coplanar upper surfaces provide planarization advantages necessary for high density multilevel interconnect structures. FIG. 9 illustrates a completed product resulting from the processing sequence which forms two levels of conductors selectively interconnected by plug 30. The sequence shown in FIGS. 2–9 is provided to illustrate one exemplary embodiment for forming an interconnect structure using a single via etch step and dual (two) fill steps. The second conductive material 38 can be dissimilar from the first conductive material 28 depending upon the desired resistance characteristics.

Figure 10:
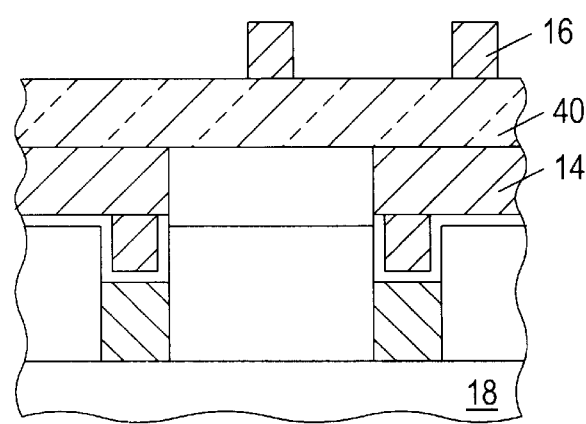
FIG. 10 illustrates a processing step subsequent to that of FIG. 9, wherein a third set of conductors are formed a dielectrically spaced distance over the first set of conductors to complete three interconnect levels of the exemplary multilevel interconnect structure of FIG. 1.

FIG. 10 illustrates a processing step sequence subsequent to that of FIG. 9. More specifically, FIG. 10 illustrates a third dielectric 40 placed upon a second set of conductors 14. The third dielectric is thereby interposed between second set of conductors 14 and third set of conductors 16. FIG. 10 thereby depicts three of possibly numerous levels of interconnect, illustrative of the exemplary form shown in FIG. 1. It is understood that a plug, similar to plug 30 (shown in FIG. 6) may be employed beneath third conductors 16, if desired. The plug can be formed within dielectric 40 to underlying second conductors 14 to enhance conductivity therebetween.

Turning now to FIGS. 11–16, an alternative exemplary embodiment is illustrated. FIGS. 11–16 depict another sequence of steps useful in producing multilevel interconnect structure 10. More specifically, FIGS. 11–16 illustrate a single via etch and single fill process which is less complex and cumbersome than the sequence shown in FIGS. 2–9. However, the sequence of FIGS. 11–16 requires that the plug material be of the same composition as the second set of conductors. Depending upon the material chosen, and the desired ohmic characteristics of the contact, this limitation is a viable alternative.

Figure 11:
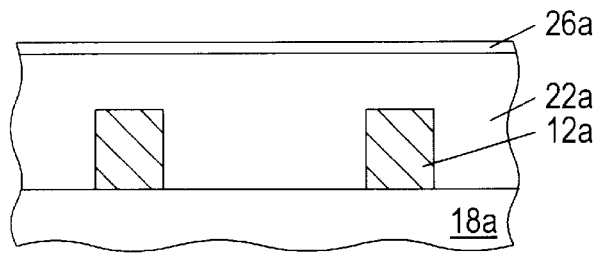
FIG. 11 is a cross-sectional view along plane A of FIG. 1, wherein a first set of conductors are formed upon a semiconductor topography.

Turning now to FIGS. 11–16, a first dielectric 22a as shown in FIG. 11 deposited upon first set of conductors 12a. First set of conductors 12a are formed upon semiconductor topography 18a, and a barrier layer 26a is deposited upon first dielectric 22a.

Figure 12:
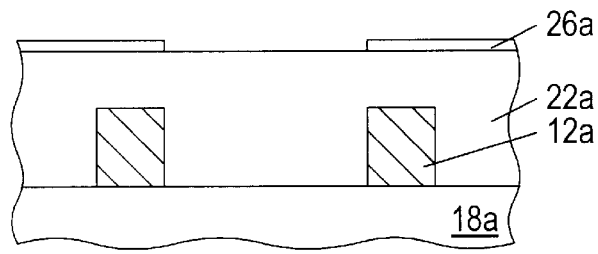
FIG. 12 illustrates a processing step subsequent to that of FIG. 11, wherein a barrier layer is selectively removed between the first set of conductors.
Figure 13:
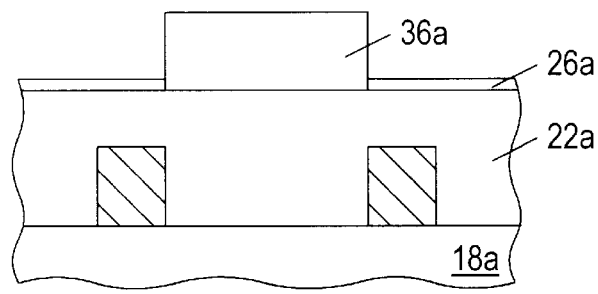
FIG. 13 illustrates a processing step subsequent to that of FIG. 12, wherein a second dielectric is formed in the region removed of the barrier layer.

FIG. 12 illustrates selective removal of barrier layer 26a in regions above and between first set of conductors 12a. FIG. 13 depicts subsequent formation of second dielectric 36a in regions removed of barrier 26a. Dielectric 36a is preferably formed by blanket depositing a dielectric material and thereafter selectively removing the material leaving dielectric 36a (shown in FIG. 13) substantially intact.

Figure 14:
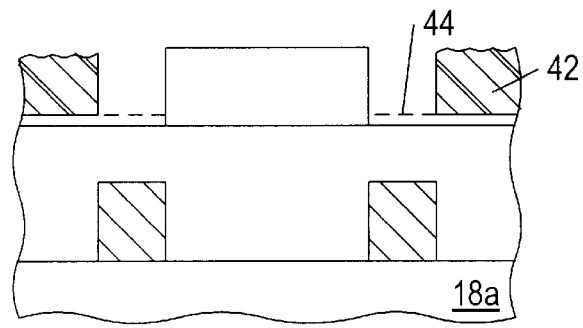
FIG. 14 illustrates a processing step subsequent to that of FIG. 13, wherein select regions overlying the first set of conductors adjacent to the second dielectric are removed.
Figure 15:
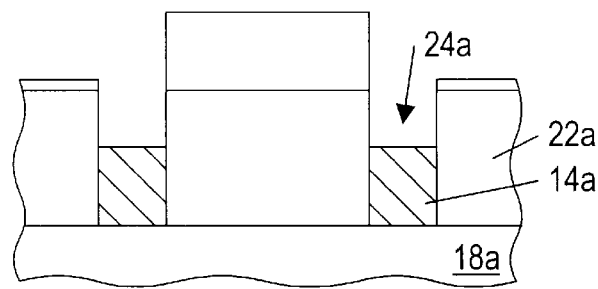
FIG. 15 illustrates a processing step subsequent to that of FIG. 14, wherein the first dielectric is selectively removed to form vias directly above select ones of the first set of conductors.

FIG. 14 illustrates a photoresist layer 42 which has been selectively removed to expose barrier layer 26a in regions directly above first set of conductors 14a. Thereafter, the exposed barrier layer 26a is removed, as shown by dashed lines 44. Selective removal of barrier 26a allows exposure of underlying first dielectric 22a and, according to the step shown in FIG. 15, removal of that underlying dielectric. First dielectric 22a is sufficiently removed so as to expose as much as possible the upper surface of first set of conductors 14a, shown in FIG. 15. The removal of first dielectric 22a and exposure of underlying conductors 12a causes formation of vias 24a.

Figure 16:
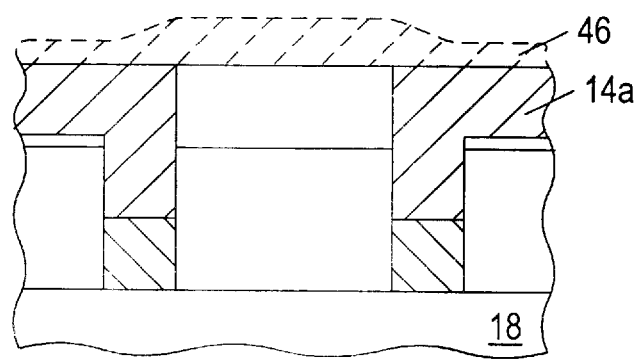
FIG. 16 illustrates a processing step subsequent to that of FIG. 15, wherein the vias and regions bounded by the second dielectric are filled by a single conductive material and thereafter planarized to conclude steps shown in FIGS. 11–16 for forming a second set of conductors electrically coupled to the first set of conductors by a single via etch and single fill process according to one embodiment of the present invention.
Figure 17:
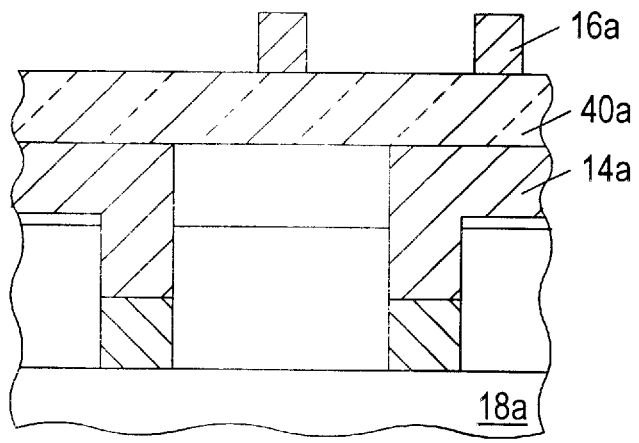
FIG. 17 illustrates a processing step subsequent to that of FIG. 16, wherein a third set of conductors are formed a dielectrically spaced distance over the second set of conductors to complete the three interconnect levels of the exemplary multilevel interconnect structure of FIG. 1.

Formation of vias 24a and second dielectric 36a defines the first and only fill region. The fill region is laterally bounded by second dielectric 36a, having a lower elevational depth equal to the upper surface of second set of conductors 14a. Thus, a single fill deposition cycle is needed to present a first and only conductive material 46 within the defined fill geometry. Conductive material 46, preferably copper or copper alloy, entirely fills via 24a as well as the elevational disparity between barrier 26a upper surface and second dielectric 36a upper surface. As such, a subsequent planarization step ensues for removing conductive material upper surface to an elevational level commensurate with the upper surface of second dielectric 36a. The resulting product is a second set of conductors 14a. FIG. 16 thereby culminates the processing sequence beginning with FIG. 11, and specifically the process sequence used to form a multilevel interconnect structure using a single etch and single fill process. The single etch is used to produce vias 24, and the single fill step is used to produce a second set of conductors 14a. FIG. 17 is a processing step subsequent to that shown in FIG. 16, wherein a third dielectric 40a is formed over conductors 14a, and a third set of conductors 16a are formed over third dielectric 40a.

It is undertstood that the sequence of steps shown in FIGS. 2–10 as well as the steps shown in FIGS. 11–17 can be repeated to produce multilevel interconnect structures bearing many more than three interconnect levels. It is also understood that the barrier 26 or 26a is advantageously placed, in every instance, between a dielectric (first dielectric 22 or 22a) and an overlying conductor (second set of conductors 14 or 14a). The present sequence of processing steps thereby advantageously configures a barrier layer, and forms a low resistive contact in vias formed by single etch step followed by fill of that via either separately from the overlying interconnect or as part of that interconnect. It is thereby appreciated by those skilled in the art having the benefit of this disclosure that this invention is believed to be capable of applications with any integrated circuit fabrication process. Furthermore, it is also to be understood that invention shown and described is to be taken as presently Preferred embodiments. Various modifications and changes may be made to each and every processing step as would be obvious to a person skilled in the art without departing from the spirit and scope of the invention as set forth in the claims. It is intended that the following claims be interpreted to embrace all such modifications and changes. And accordingly, the specification and drawings are to be regarded in an illustrative rather than restrictive sense.

What is claimed is:

1. A method for forming a multilevel interconnect structure having a first, a second and a third set of conductors formed on substantially separate elevational levels from each other, comprising:

forming a first set of substantially coplanar conductors across a semiconductor topography;

depositing a first dielectric across said first set of conductors;

depositing a barrier layer upon said first dielectric and thereafter forming an opening through said barrier layer directly above a region arranged laterally between a pair of said first set of conductors;

depositing a second dielectric within said opening and, using said second dielectric as a partial masking layer, thereafter etching through said barrier layer and said first dielectric in a region directly above said first set of conductors to form a via which is aligned with an edge of said second dielectric;

forming a conductive layer within said via, wherein the conductive layer includes an upper surface commensurate with an upper surface of said second dielectric to form a second set of substantially coplanar conductors laterally spaced from each other by said second dielectric;

depositing a third dielectric upon said conductive layer; and forming a third set of conductors upon said third dielectric.

2. The method as recited in claim 1, wherein said first set of conductors are connected to said second set of conductor by said conductive layer formed within said via.

3. The method as recited in claim 1, wherein each said first set of conductors comprises an ion implant region.

4. The method as recited in claim 1, wherein each said first set of conductors is formed from a deposited metal.

5. The method as recited in claim 1, wherein said barrier layer comprises titanium.

6. The method as recited in claim 1, wherein said forming the conductive layer comprises:

depositing a refractory metal across the second dielectric and within said via; and removing an upper surface of said refractory metal to an elevational level equal to or below the upper surface of said second dielectric.

7. The method as recited in claim 6, wherein said removing step comprises polishing.

8. The method as recited in claim 6, wherein said removing step comprises etching.

9. The method as recited in claim 1, wherein said third dielectric is interposed between said third set of conductors and said second set of conductors.

10. A method for forming a multi-level interconnect structure having a first set of conductors electrically connected to a second set of conductors formed on a plane separate from the first set of conductors, comprising:

depositing a first dielectric across a semiconductor topography having a first set of conductors arranged thereon;

forming a barrier layer upon said first dielectric, said barrier layer having openings which extend through said barrier layer to expose said first dielectric in a region directly above a space which laterally separates a pair of said first set of conductors;

forming a second dielectric only upon said openings to a thickness above said barrier layer;

removing said barrier layer and said first dielectric at the outer periphery of said second dielectric directly above said first set of conductors to form at least one via; and forming a second set of conductors within said via, wherein at least two of said second set of conductors are laterally separated by said second dielectric.

11. The method as recited in claim 10, wherein said first set of conductors are electrically connected to said second set of conductor by said conductive layer placed within said via.

12. The method as recited in claim 10, wherein each said first set of conductors comprises an ion implant region.

13. The method as recited in claim 10, wherein each said first set of conductors is formed from a deposited metal.

14. The method as recited in claim 10, wherein said barrier layer comprises titanium.

15. The method as recited in claim 10, wherein said forming said second set of conductors comprises:

depositing a refractory metal across the second dielectric and within said via; and removing an upper surface of said refractory metal to an elevational level equal to or below the upper surface of said second dielectric.

16. The method as recited in claim 15, wherein said removing step comprises polishing.

17. The method as recited in claim 15, wherein said removing step comprises etching.

18. The method as recited in claim 10, wherein said second set of conductors extend above at least a portion of said first dielectric and also extend within said via to an upper surface of said first set of conductors.

19. A method for forming electrical connection between a first and a second set of conductors formed on separate elevational levels, comprising:

providing a first dielectric upon a first set of conductors arranged upon a semiconductor topography;

removing said first dielectric directly above said first set of conductors;

depositing a second dielectric upon said first dielectric exclusively in a region directly above a space between a pair of said first set of conductors to form a fill site laterally bounded by said second dielectric; and forming a second set of conductors separated by said second dielectric by filling said fill site with a conductive material to an elevational level substantially equal to an upper surface of said second dielectric.

20. The method as recited in claim 19, further comprising:

forming a barrier layer across said first dielectric and said first pair of conductors subsequent to said removing of said first dielectric; and removing said barrier layer exclusively from said region of said first dielectric directly above said space prior to said depositing of said second dielectric.

* * * * *